United States Patent
Mae

(10) Patent No.: US 7,466,619 B2
(45) Date of Patent: Dec. 16, 2008

(54) SEMICONDUCTOR MEMORY DEVICE

(75) Inventor: Kenji Mae, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/760,959

(22) Filed: Jun. 11, 2007

(65) Prior Publication Data

US 2008/0008024 A1 Jan. 10, 2008

(30) Foreign Application Priority Data

Jul. 7, 2006 (JP) ............................. 2006-187696

(51) Int. Cl.
*G11C 8/00* (2006.01)
(52) U.S. Cl. ..................... 365/230.03; 365/230.06; 365/230.08
(58) Field of Classification Search ............ 365/230.03, 365/230.06, 230.08, 189.05
See application file for complete search history.

(56) References Cited

U.S. PATENT DOCUMENTS 6,944,081 B2 * 9/2005 Takahashi et al. ........... 365/222

2001/0038569 A1 * 11/2001 Fujisawa et al. ............ 365/233

FOREIGN PATENT DOCUMENTS

| JP | 08-255479 A | 10/1996 |
| JP | 11-163-48 A | 1/1999 |
| JP | 11-203858 A | 7/1999 |
| JP | 2000-113670 A | 4/2000 |
| JP | 2000-251471 A | 9/2000 |

* cited by examiner

*Primary Examiner*—Richard Elms
*Assistant Examiner*—Toan Le
(74) *Attorney, Agent, or Firm*—Sughrue Mion, PLLC

(57) ABSTRACT

A semiconductor memory device includes a plurality of banks #0 to #3, a predecoder that generates a predecode signal, first latch circuits, each of which is assigned to the banks, that hold a first portion of the predecode signal, a main decoder that is assigned in common to the two banks, and receives a second portion of the predecode signal and outputs of the first latch circuits. The main decoder includes latch circuits that hold by each bank a decoded signal obtained by decoding the second portion of the predecode signal. In the present invention, an address through predecoder is used to latch a predecode signal, and hence it becomes possible to share one portion of the predecode signal between the banks.

13 Claims, 15 Drawing Sheets

SEMICONDUCTOR MEMORY DEVICE

TECHNICAL FIELD

The present invention relates to a semiconductor memory device. More specifically, the present invention relates to a semiconductor memory device of which memory cell region is divided into a plurality of banks.

BACKGROUND OF THE INVENTION

Generally, in semiconductor memory devices such as a DRAM (Dynamic Random Access Memory), a memory cell region is divided into a plurality of banks. Each bank is configured to be independently operable (see Japanese Patent Application Laid-Open No. 2000-113670 and Japanese Patent Application Laid-Open No. H11-16348). Thereby, it becomes possible to start a read operation from or a write operation into a different bank while the read operation or the write operation is executed on a certain bank. Thus, a high-speed data transfer is achieved.

A general bank arrangement is as shown in FIG. 11. Such an arrangement is suitable to a case where a pad electrode region 10 is arranged between the banks. However, in some products, pad electrode regions 11 and 12 are occasionally arranged at ends of a chip as shown in FIG. 12. The arrangement is often adopted when a data I/O width is large. When the arrangement shown in FIG. 12 is adopted, a data bus connecting an I/O pad DQ and a peripheral circuit region located between the banks (not shown) are long, and a plurality of data to be simultaneously inputted or outputted pass by way of data buses that differ in length. As a result, there occurs a problem in that a data transfer speed decreases.

For example, when the data I/O width is 2n bits, and 2n bits of data are read via n of input/output pads DQ arranged in the respective pad electrode regions 11 and 12, n bits of data read from a bank #0 to the side of the pad electrode region 11 pass by way of a relatively short data bus while remaining n bits of data read from the bank #0 to the other side of the pad electrode region 12 pass by way of a relatively long data bus.

Accordingly, when the pad electrode regions 11 and 12 are arranged in the ends of the chip as shown in FIG. 12, it is desired that each bank is positioned in an aligning manner between the pad electrode regions 11 and 12, as shown in FIG. 13. With this arrangement, it becomes possible to assign n of input/output pads DQ arranged in the pad electrode region 11 to a sub-bank region 21 located on the side of the pad electrode region 11, and assign remaining n of input/output pads DQ arranged in the pad electrode region 12 to a sub-bank region 22 located on the side of the pad electrode region 12. As a result, it becomes possible to shorten the data bus, and redress imbalance of the data bus length.

On the other hand, to operate each bank in parallel, an address supplied to each bank needs to be latched at some stage. Accordingly, in general, as shown in FIG. 14, row-address latch circuits 30 to 33, predecoders 40 to 43, and main decoders 50 to 53, which correspond to each bank, are arranged respectively.

FIG. 15 is a schematic layout diagram of an example in which a circuit configuration shown in FIG. 14 is applied to a semiconductor memory device of which banks are positioned in an aligning manner.

In the example shown in FIG. 15, the row-address latch circuits 30 to 33 and the predecoders 40 to 43 are arranged between the sub-bank regions 21 and 22, and the main decoders 50 to 53 are arranged between banks #0 and #1 and banks #2 and #3, respectively.

However, when such a layout is adopted, there is a problem in that the number of buses connecting the predecoders 40 to 43 and the main decoders 50 to 53 increases. For a more specific explanation, considered is a case in which out of the row address, a portion for selecting a memory mat within the bank is $X_{MAT}$, a portion for selecting a main word line is $X_{MWL}$, a portion for selecting a sub word line is $X_{SWL}$; and each portion is a-bits, b-bits, and c-bits. Further, assume that predecoding is performed by dividing the portion $X_{MAT}$ for selecting the memory mat into a1 high-order bit and a2 low-order bits; and dividing the portion $X_{MWL}$ for selecting the main word line into b1 high-order bit and b2 low-order bits.

In this case, the number of predecode signals, which are outputs of the predecoders 40 to 43, is $2^{a1}+2^{a2}+2^{b1}+2^{b2}+2^{c}$. As an example, when a1=2 bits, a2=2 bits, b1=3 bits, b2=3 bits, and c=2 bits are established, the number of predecode signals is 28. That is, each of the predecoders 40 to 43 and the main decoders 50 to 53 needs to be connected by 28 buses.

Further, as shown in FIG. 15, between the banks, two main decoders 50 and 51 or 52 and 53 that correspond to the banks on the both sides (for example, the bank #0 and the bank #1) are arranged. Thus, the buses for the predecode signal that is formed between the banks are 56 in total (=2×28), and as a result, a wire pitch becomes very narrow.

In addition, in the circuit configurations shown in FIGS. 14 and 15, the row address is latched in each bank. Thus, a delay by a latch margin (tRCD) occurs, and this leads to a problem in that an operating margin becomes small.

SUMMARY OF THE INVENTION

The present invention has been achieved to solve the above problems, and it is therefore an object the invention to provide a semiconductor memory device capable of reducing buses for a predecode signal formed between banks.

Another object of the present invention is to provide a semiconductor memory device that can enlarge an operating margin.

The above and other objects of the present invention can be accomplished by a semiconductor memory device comprising:

a plurality of banks independently operable;

a predecoder that predecodes an address signal to generate a predecode signal including first and second portions;

first latch circuits, each of which is assigned to the plurality of banks, that hold the first portion of the predecode signal;

a main decoder that is assigned in common to at least two of the plurality of banks, and receives the second portion of the predecode signal and outputs of the first latch circuits, wherein the main decoder includes second latch circuits that hold by each bank a decoded signal obtained by decoding the second portion of the predecode signal.

According to the present invention, the address signal is not latched in each bank, but a so-called address through predecoder is used to latch a predecode signal. Thereby, one portion of the predecode signal can be shared between the banks. Thus, it becomes possible to reduce the wires for the predecode signal installed between the banks. In addition, a delay by a latch margin (tRCD) does not occur in each bank, and hence it becomes possible to enlarge an operating margin.

In the case where the address signal is a row address, it is preferable that the first portion of the predecode signal includes a main-word select predecode signal for selecting a main word line. It is also preferable that the second portion of the predecode signal includes a memory-mat select predecode signal for selecting a memory mat and a sub-word select predecode signal for selecting a sub word line.

In this case, it is preferable the main decoder includes:

a main-word control circuit that generates a first internal signal by each bank based on at least the memory-mat select predecode signal and a bank select signal;

a main-word output circuit that generates a main-word-line select signal by each bank based on at least the main-word select predecode signal and the corresponding first internal signal; and a sub-word control circuit that generates a sub-word-line select signal by each bank based on at least the sub-word select predecode signal and the bank select signal.

It is preferable that the second latch circuits includes:

a plurality of memory-mat select latch circuits, included in the main-word control circuit, that synchronize the memory-mat select predecode signal or a second internal signal obtained by decoding the memory-mat select predecode signal with the bank select signal and hold by each bank; and a plurality of sub-word select latch circuits, included in the sub-word control circuit, that synchronize the sub-word select predecode signal or a third internal signal obtained by decoding the sub-word select predecode signal with the bank select signal and hold by each bank.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
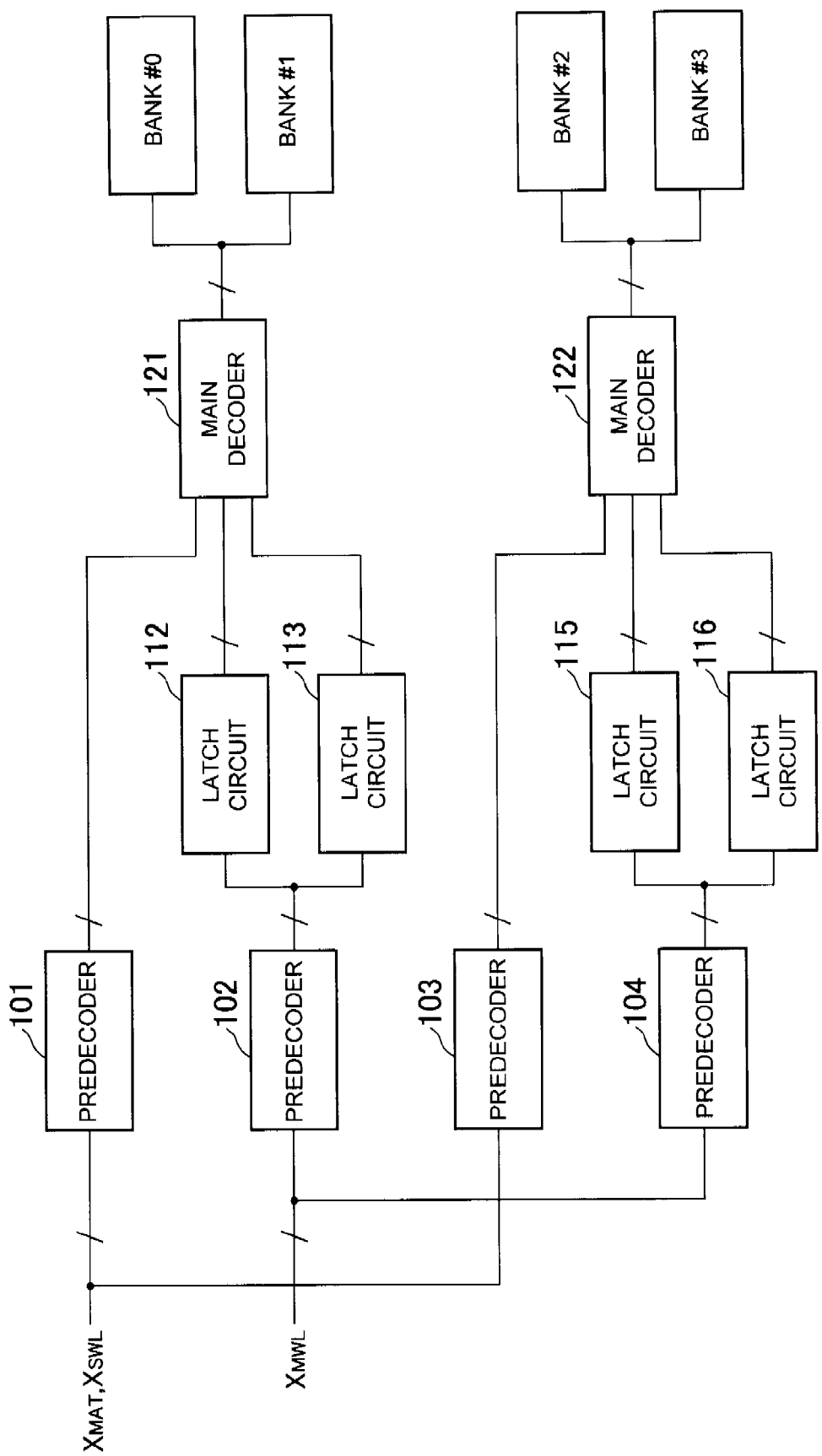
FIG. 1 is a block diagram showing a configuration of main parts of a semiconductor memory device according to a preferred embodiment of the present invention.

FIG. 1 is a block diagram showing a configuration of main parts of a semiconductor memory device according to a preferred embodiment of the present invention.

As shown in FIG. 1, the semiconductor memory device according to the present embodiment includes four banks #0 to #3, each of which is independently operable. A plurality of memory cells included in these banks #0 to #3 are accessed based on a row address (and a bank address) and a column address. In the present embodiment, a description is made by focusing on a flow of the row address (and a bank address).

The row address is a signal for selecting a plurality of word lines formed in the bank, and configured of a portion $X_{MAT}$ for selecting a memory mat, a portion $X_{MWL}$ for selecting a main word line, and a portion $X_{SWL}$ for selecting a sub word line. As shown in FIG. 1, out of the row address, the portion $X_{MAT}$ for selecting the memory mat and the portion $X_{SWL}$ for selecting the sub word line are commonly supplied to predecoders 101 and 103. The portion $X_{MWL}$ for selecting the main word line is commonly supplied to predecoders 102 and 104. Both the predecoders 101 and 102 correspond to the banks #0 and #1, and both the predecoders 103 and 104 correspond to the banks #2 and #3. The predecoders 101 to 104 are so-called address through predecoders, and at a stage before the address is inputted into the predecoders, the address is not latched.

Figure 2:
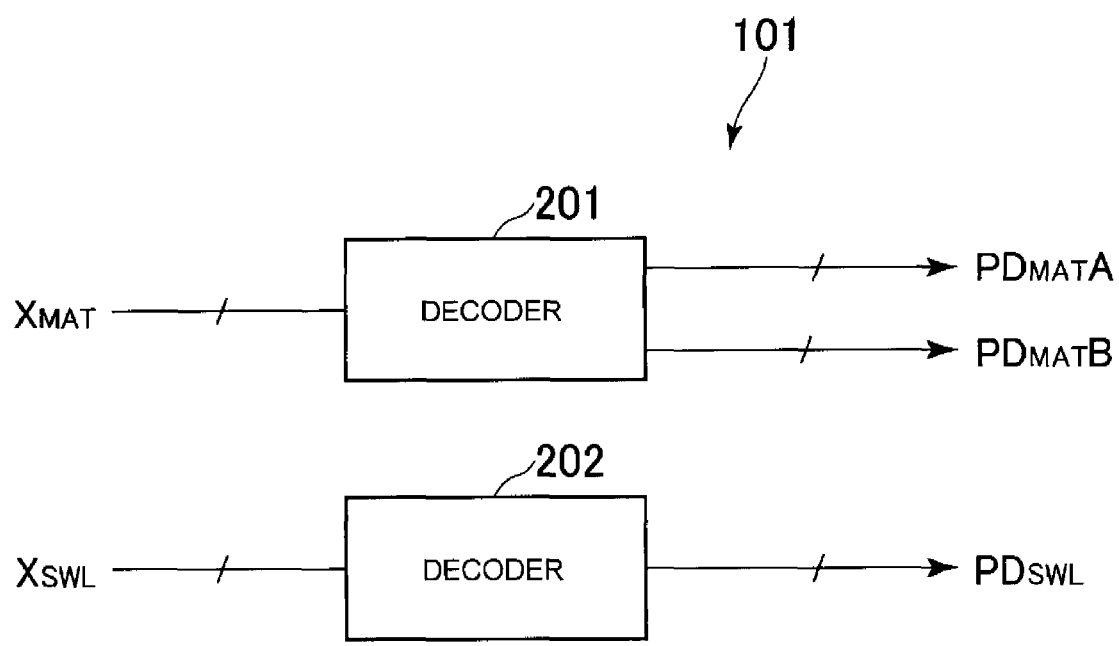
FIG. 2 is a block diagram showing a configuration of the predecoder 101.

FIG. 2 is a block diagram showing a configuration of the predecoder 101. The configuration of the other predecoder 103 has the same configuration as the predecoder 101 shown in FIG. 2, and therefore redundant explanations thereof will be omitted.

As shown in FIG. 2, the predecoder 101 is configured of a decoder 201 corresponding to the portion $X_{MAT}$ for selecting the memory mat and a decoder 202 corresponding to the portion $X_{SWL}$ for selecting the sub word line. The decoder 201 decodes the portion $X_{MAT}$ into a1 high-order bit and a2 low-order bits, where the number of bits of the portion $X_{MAT}$ for selecting the memory mat is a-bits. Accordingly, the decoder 201 outputs two predecode signals $PD_{MAT}A$ and $PD_{MAT}B$. The predecode signal $PD_{MAT}A$ is a decode result of the a1 high-order bit of $X_{MAT}$, and the predecode signal $PD_{MAT}B$ is a decode result of the a2 low-order bits of $X_{MAT}$. The predecode signals $PD_{MAT}A$ and $PD_{MAT}B$ are predecode signals for selecting the memory mat.

As an example, when a1=2 bits and a2=2 bits are established, both the predecode signals $PD_{MAT}A$ and $PD_{MAT}B$ are 4-bit signals, and any 1 bit of the both signals is in an active state.

On the other hand, the decoder 202 directly decodes the portion $X_{SWL}$ for selecting the sub word line to generate a predecode signal $PD_{SWL}$. The predecode signal $PD_{SWL}$ is a predecode signal for selecting a sub word. Herein, when the number of bits of the portion $X_{SWL}$ for selecting the sub word line is c-bits, where c=2, the predecode signal $PD_{SWL}$ is a 4-bit signal, and any 1 bit of the signal is in an active state.

The predecoders 101 and 103 having such a configuration are not arranged to each bank, but only one predecoder is arranged to the two banks. That is, the predecoder 101 is common to the banks #0 and #1, and the predecoder 103 is common to the banks #2 and #3.

Figure 3:
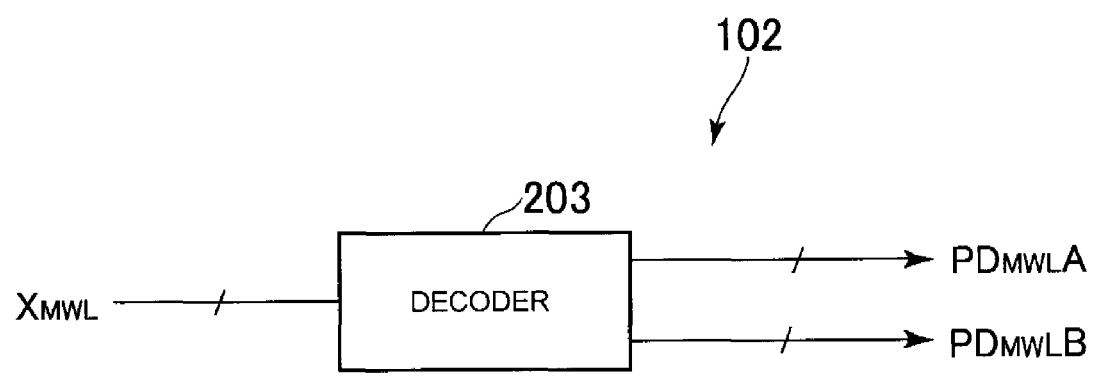
FIG. 3 is a block diagram showing a configuration of the predecoder 102.

FIG. 3 is a block diagram showing a configuration of the predecoder 102. The configuration of the other predecoder 104 has the same configuration as the predecoder 102 shown in FIG. 3, and therefore redundant explanations thereof will be omitted.

As shown in FIG. 3, the predecoder 102 is configured of a decoder 203 corresponding to the portion $X_{MWL}$ for selecting the main word line. The decoder 203 divides the portion $X_{MWL}$ for selecting the main word line into a b1 high-order bit and b2 low-order bits, where the number of bits of the portion $X_{MWL}$ for selecting the main word line is b-bits. Accordingly, the decoder 203 outputs two predecode signals $PD_{MWL}A$ and $PD_{MWL}B$. The predecode signal $PD_{MWL}A$ is a decode result of the b1 high-order bit of $X_{MWL}$, and the predecode signal $PD_{MWL}B$ is a decode result of the b2 low-order bit of $X_{MWL}$. The predecode signals $PD_{MWL}A$ and $PD_{MWL}B$ are predecode signals for selecting the main word.

As an example, when b1=3 bits and b2=3 bits are established, both the predecode signals $PD_{MWL}A$ and $PD_{MWL}B$ are 8-bit signals, and any 1 bit of the respective signals is in an active state.

The predecoders 102 and 104 having such a configuration are not arranged to each bank, but only one predecoder is arranged to the two banks. That is, the predecoder 102 is common to the banks #0 and #1, and the predecoder 104 is common to the banks #2 and #3.

Figure 4:
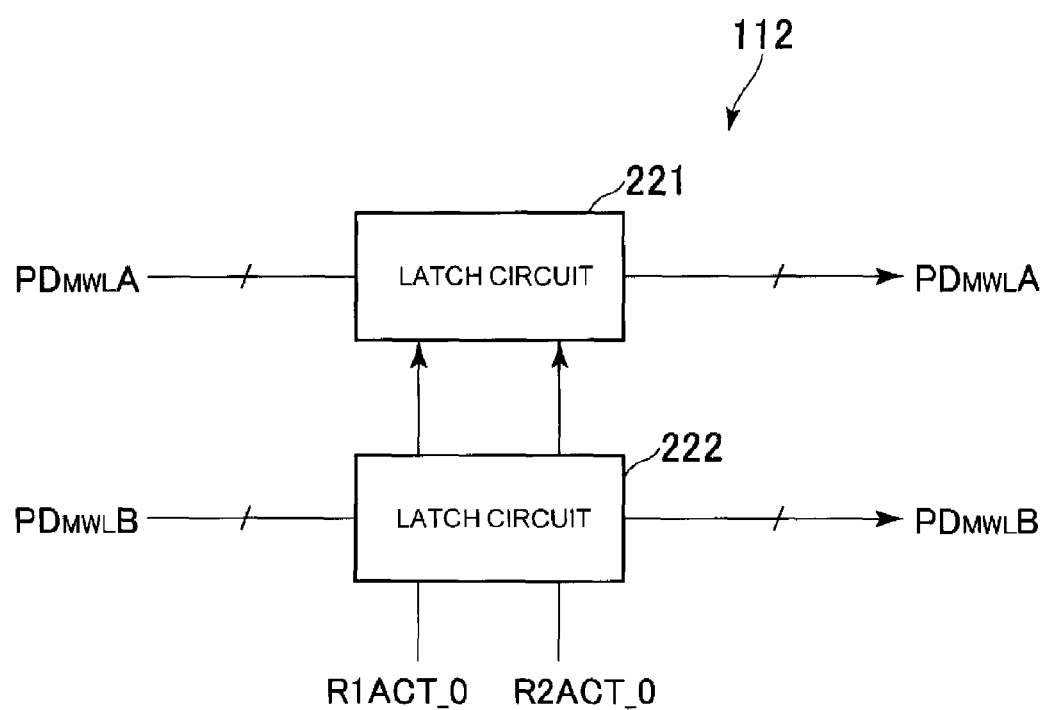
FIG. 4 is a block diagram showing a configuration of a latch circuit 112.

FIG. 4 is a block diagram showing a configuration of a latch circuit 112. The configurations of other latch circuits 113, 115, and 116 are the same as that of the latch circuit 112 shown in FIG. 4, and therefore redundant explanations thereof will be omitted.

As shown in FIG. 4, the latch circuit 112 is configured of a latch circuit 221 that holds the predecode signal $PD_{MWL}A$ and a latch circuit 222 that holds the predecode signal $PD_{MWL}B$. The latch circuit 112 having such a configuration is arranged to each bank. That is, the latch circuits 112, 113, 115, and 116 correspond to the banks #0, #1, #2, and #3, respectively.

As shown in FIG. 1, the two latch circuits 112 and 113 are commonly supplied the predecode signal from the predecoder 102. A bank select signal selects which of the latch circuits hold the predecode signal. That is, as shown in FIG. 4, the latch circuit 112 corresponding to the bank #0 is supplied bank select signals R1ACT_0 and R2ACT_0 corresponding to the bank #0, and holds the predecode signal in response to these signals. Although not shown, the latch circuit 113 corresponding to the bank #1 is supplied bank select signals R1ACT_1 and R2ACT_1 corresponding to the bank #1, and the latch circuit 112 holds the predecode signal in response to these signals. Thereby, in each latch circuit 112, 113, 115, and 116, the predecode signals $PD_{MWL}A$ and $PD_{MWL}B$ corresponding to each bank are held.

As shown in FIG. 1, the output of the predecoder 101 and the outputs of the latch circuits 112 and 113 are supplied to a main decoder 121, and the output of the predecoder 103 and the outputs of the latch circuits 115 and 116 are supplied to a main decoder 122. The main decoder 121 is a circuit common to the banks #0 and #1, and the main decoder 122 is a circuit common to the banks #2 and #3.

Figure 5:
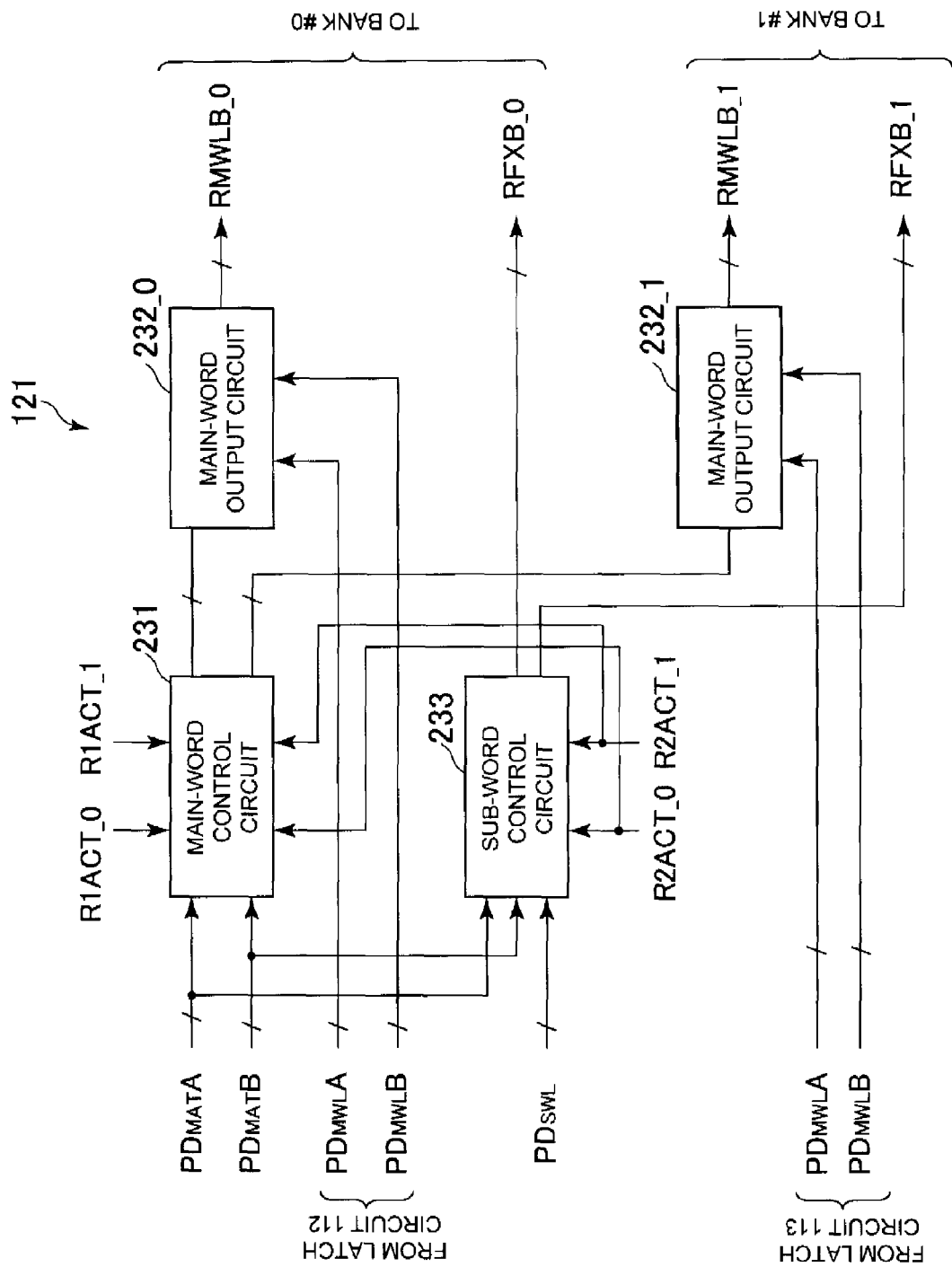
FIG. 5 is a block diagram showing a configuration of the main decoder 121.

FIG. 5 is a block diagram showing a configuration of the main decoder 121. The configuration of the main decoder 122 is the same as that of the main decoder 121 shown in FIG. 5, and therefore redundant explanations thereof will be omitted.

As shown in FIG. 5, the main decoder 121 is a circuit that receives the predecode signals $PD_{MAT}A$, $PD_{MAT}B$, $PD_{MWL}A$, $PD_{MWL}B$, and $PD_{SWL}$, and generates a main-word-line select signal RMWLB and a sub-word-line select signal RFXB. The main decoder 121 is configured of a main-word control circuit 231, main-word output circuits 232_0 and 232_1, and a sub-word control circuit 233. Out of the signals supplied to the main decoder 121, the predecode signals $PD_{MWL}A$ and $PD_{MWL}B$ are supplied from both the latch circuits 112 and 113.

Out of the circuits that configure the main decoder 121, the main-word control circuit 231 and the sub-word control circuit 233 are common to the banks #0 and #1. However, the main-word output circuits 232_0 and 232_1 are arranged to the banks #0 and #1, respectively.

Out of the main-word-line select signals RMWLB, the signal written as "RMWLB_0" corresponds to the bank #0, and the signal written as "RMWLB_1" corresponds to the bank #1. Likewise, out of the sub-word-line select signals RFXB, the signal written as "RFXB_0" corresponds to the bank #0, and the signal written as "RFXB_1" corresponds to the bank #1.

Figure 6:
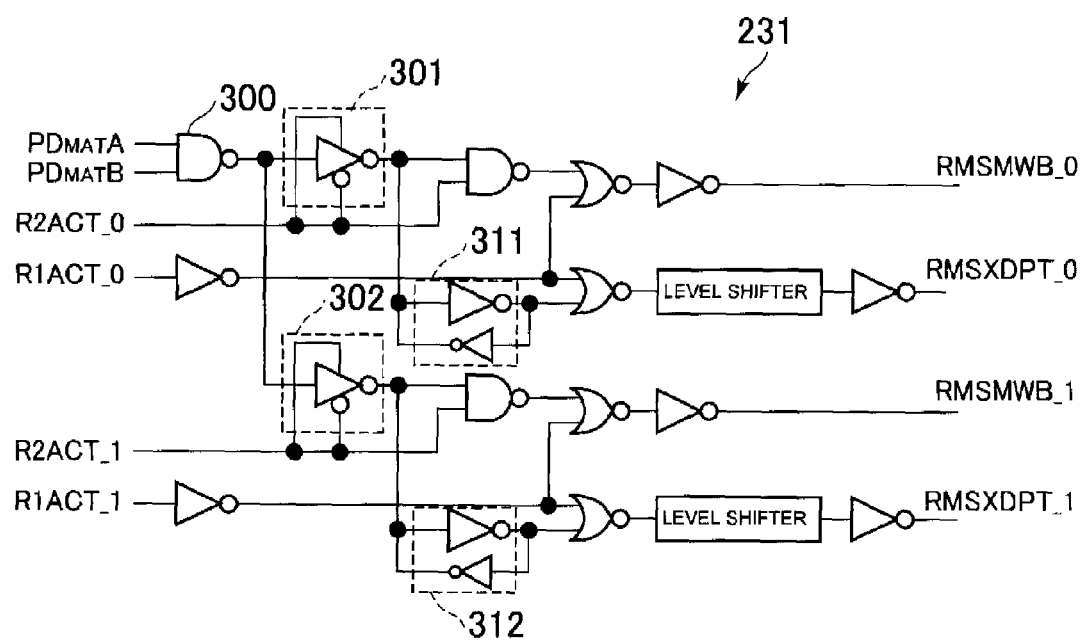
FIG. 6 is a circuit diagram of a main-word control circuit 231.
Figure 7:
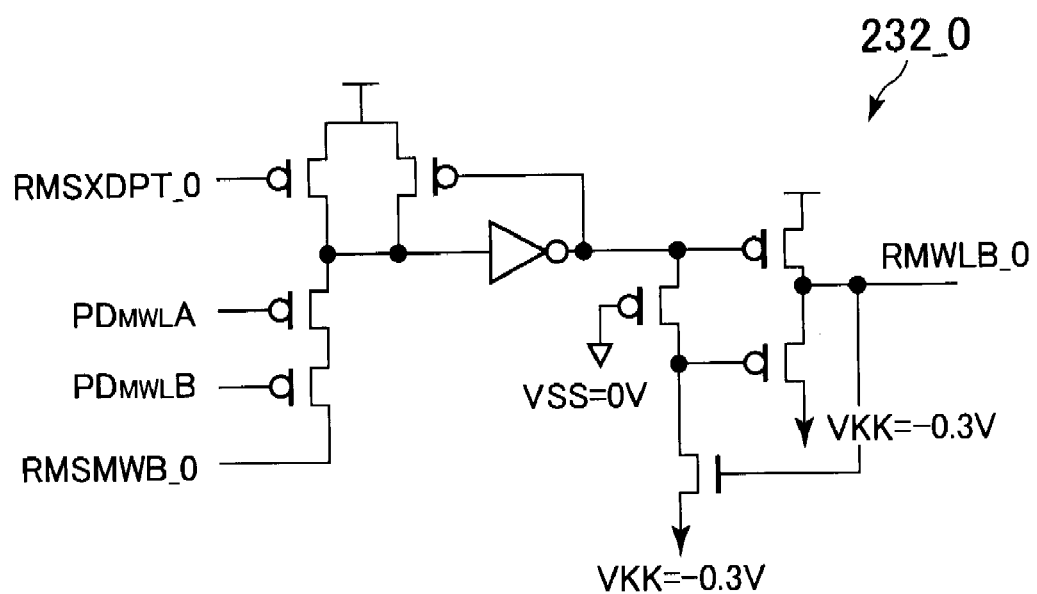
FIG. 7 is a circuit diagram of a main-word output circuit 232_0.
Figure 8:
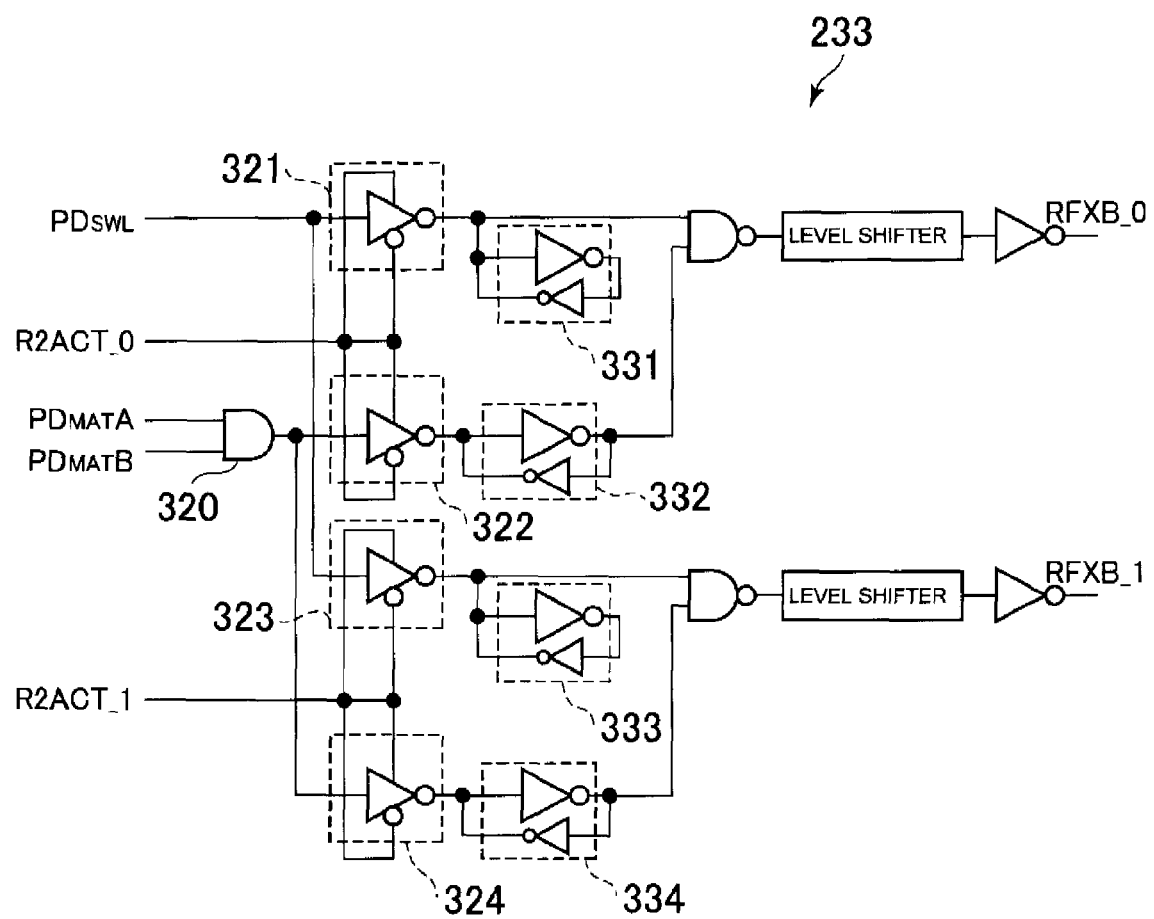
FIG. 8 is a circuit diagram of a sub-word control circuit 233.

FIG. 6 to FIG. 8 are circuit diagrams of the main-word control circuit 231, the main-word output circuit 232_0, and the sub-word control circuit 233, respectively. The configuration of the main-word output circuit 232_1 is the same as that of the main-word output circuit 232_0 shown in FIG. 7, and therefore redundant explanations thereof will be omitted.

The main-word control circuit 231 shown in FIG. 6 includes: an NAND gate 300 to which a predetermined 1 bit of the predecode signal $PD_{MAT}A$ and a predetermined 1 bit of the predecode signal $PD_{MAT}B$ are supplied; clocked inverters 301 and 302 that receive a decoded signal, which is output, of the NAND gate 300; and latch circuits 311 and 312 that hold the outputs of the clocked inverters 301 and 302. The clocked inverters 301 and 302 are supplied the bank select signals R2ACT_0 and R2ACT_1 as timing signals, respectively. Accordingly, the decoded signal, which is the output of the NAND gate 300, is held in one of the latch circuits 311 and 312. A content to be held of the other one of the latch circuits 311 and 312 does not change.

The output of the clocked inverter 301 passes by way of several gate circuits, and an internal signal RMSMWB_0 thereby generated is supplied to the main-word output circuit 232_0 within the main decoder 121. Likewise, the output of the clocked inverter 302 also passes by way of several gate circuits, and an internal signal RMSMWB_1 thereby generated is supplied to the main-word output circuit 232_1 within the main decoder 121.

The output of the latch circuit 311 passes by way of several gate circuits and level shifters, and an internal signal RMSXDPT_0 thereby generated is supplied to the main-word output circuit 232_0 within the main decoder 121. Likewise, the output of the latch circuit 312 also passes by way of several gate circuits and level shifters, and an internal signal RMSXDPT_1 thereby generated is supplied to the main-word output circuit 232_1 within the main decoder 121.

The circuit configuration of the main-word control circuit 231 is as described above. The main-word control circuit 231 is arranged to correspond to every combination of the predecode signals $PD_{MAT}A$ and $PD_{MAT}B$. Accordingly, as in the example, when a1=2 bits and a2=2 bits are established, and $PD_{MAT}A$=4 bits and $PD_{MAT}B$=4 bits are thus established, 16 pairs (=4×4) of the main-word control circuits 231 shown in FIG. 6 are accordingly arranged within one main decoder 121. The main-word control circuit within the main decoder 122 has the same configuration as that of the circuit shown in FIG. 6, and therefore redundant explanations thereof will be omitted.

On the other hand, the main-word output circuit 232_0 shown in FIG. 7 is supplied a predetermined 1 bit of the predecode signal $PD_{MWL}A$, a predetermined 1 bit of the predecode signal $PD_{MWL}B$, and corresponding internal signals RMSMWB_0 and RMSXDPT_0. When those logics match a predetermined combination, the main-word output circuit 232_0 renders active the corresponding main-word-line select signal RMWLB_0.

The main-word output circuit 232_0 is arranged to correspond to every combination of the predecode signals $PD_{MWL}A$ and $PD_{MWL}B$. Accordingly, as in the example, when b1=3 bits and b2=3 bits are established, and $PD_{MWL}A$=8 bits and $PD_{MWL}B$=8 bits are thus established, 64 pairs (=8×8) of the main-word output circuits 232 shown in FIG. 7 are accordingly arranged by each main decoder within one main-word control circuit 231. As described above, 16 pairs of main-word control circuits 231 are arranged within one main decoder. Thus, in the main decoder 121, 1024 (=64×16) of main-word output circuits 232_0 are accordingly arranged. The other main-word output circuit 232_1 included in the main decoder 121 and the main-word output circuits included in the other main decoders 122 have the same configuration as the circuit shown in FIG. 7, and therefore redundant explanations thereof will be omitted.

As shown in FIG. 8, in the sub-word control circuit 233 includes clocked inverters 321 and 323 to which a predetermined 1 bit of the predecode signal $PD_{SWL}$ is supplied. The clocked inverter 321 is supplied the bank select signal R2ACT_0 as the timing signal, and its output is held in the latch circuit 331. On the other hand, the clocked inverter 323 is supplied the bank select signal R2ACT_1 as the timing signal, and its output is held in the latch circuit 333.

The sub-word control circuit 233 further includes an AND gate 320 to which a predetermined 1 bit of the predecode signal $PD_{MAT}A$ and either 1 bit of 2 high-order bits of the predecode signal $PD_{MAT}B$ are supplied, and its outputs are held in latch circuits 332 and 334 via clocked inverters 322 and 324.

When values held in the latch circuits 331 and 332 match a predetermined combination, the corresponding sub-word line select signal RFXB_0 is rendered active via several gate circuits. Likewise, when values held in the latch circuits 333 and 334 match a predetermined combination, the corresponding sub-word line select signal RFXB_1 is rendered active via several gate circuits.

The sub-word control circuit 233 is arranged to correspond to every combination of the inputted predecode signals. Accordingly, as in the example, when c=2 bits is established and $PD_{SWL}$=4 bits is thus established, and 4 bits of the predecode signal $PD_{MAT}A$ and 2 bits of the predecode signal $PD_{MAT}B$ are used, 32 pairs (=4×2×4) of the sub-word control circuits 233 shown in FIG. 8 are accordingly arranged within one main decoder 121. The sub-word control circuits included in the other main decoders 122 have the same configuration as that of the circuit shown in FIG. 8, and therefore redundant explanations thereof will be omitted.

The circuit configuration of the semiconductor memory device according to the present embodiment is as described above. A layout of the semiconductor memory device is described next.

Figure 9:
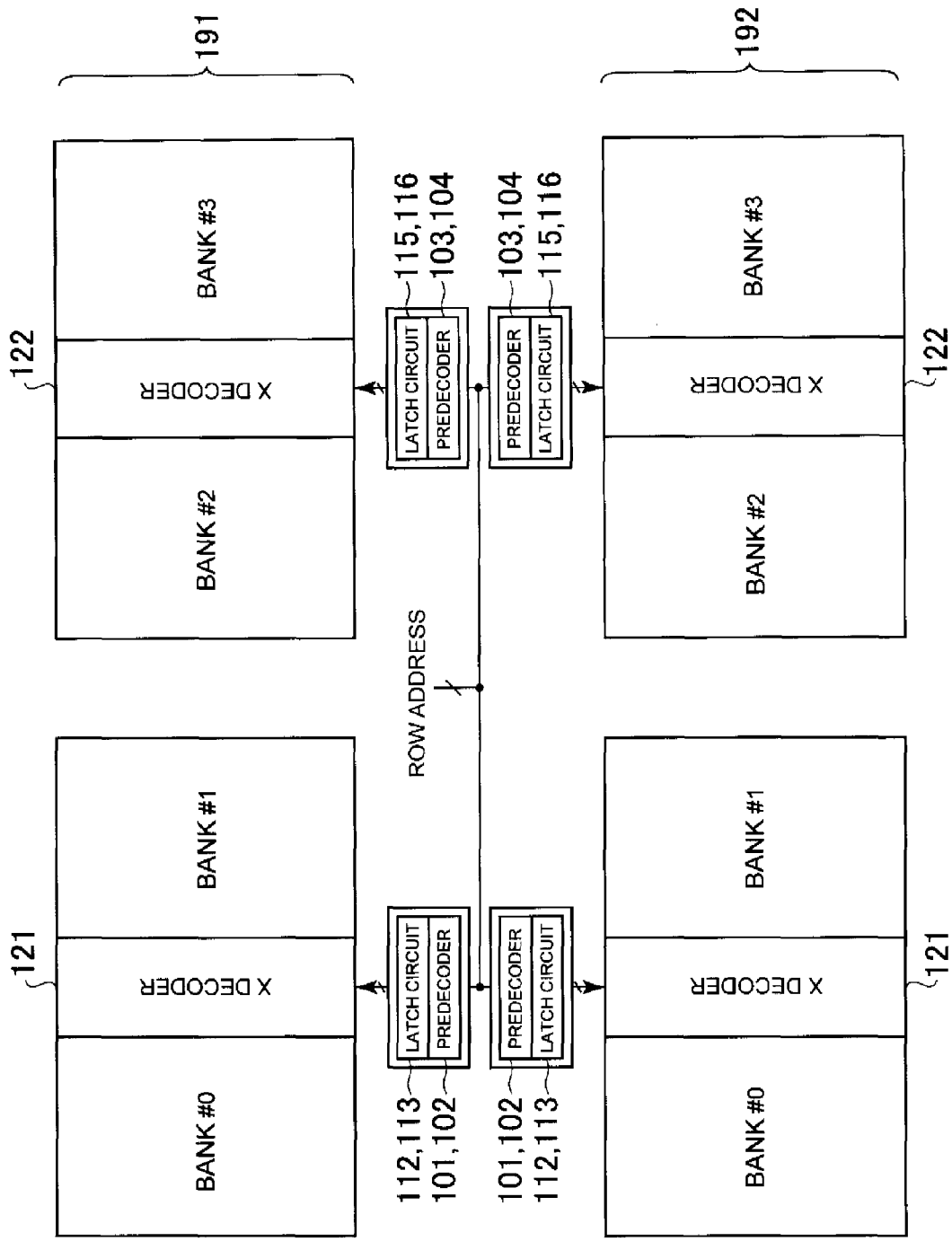
FIG. 9 is a schematic layout diagram of the semiconductor memory device according to the present embodiment.

FIG. 9 is a schematic layout diagram of the semiconductor memory device of the present embodiment.

Figure 13:
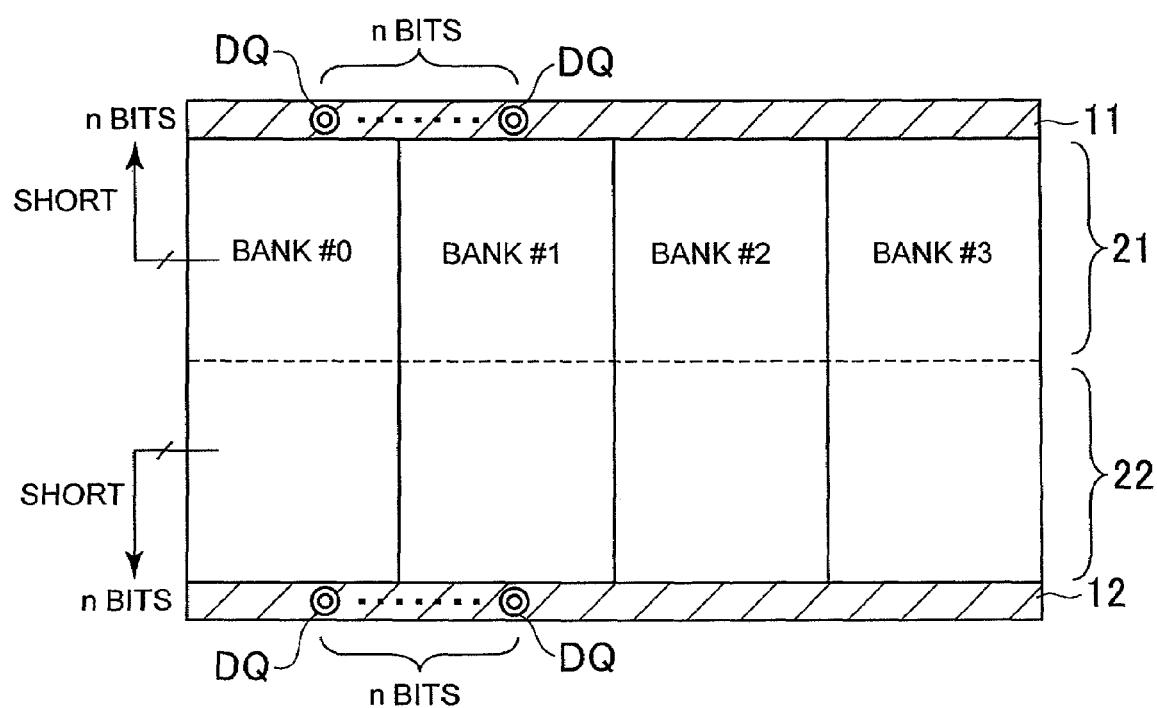
FIG. 13 is a schematic diagram showing an example of arranging banks between pad electrode regions in an aligning manner.
Figure 14:
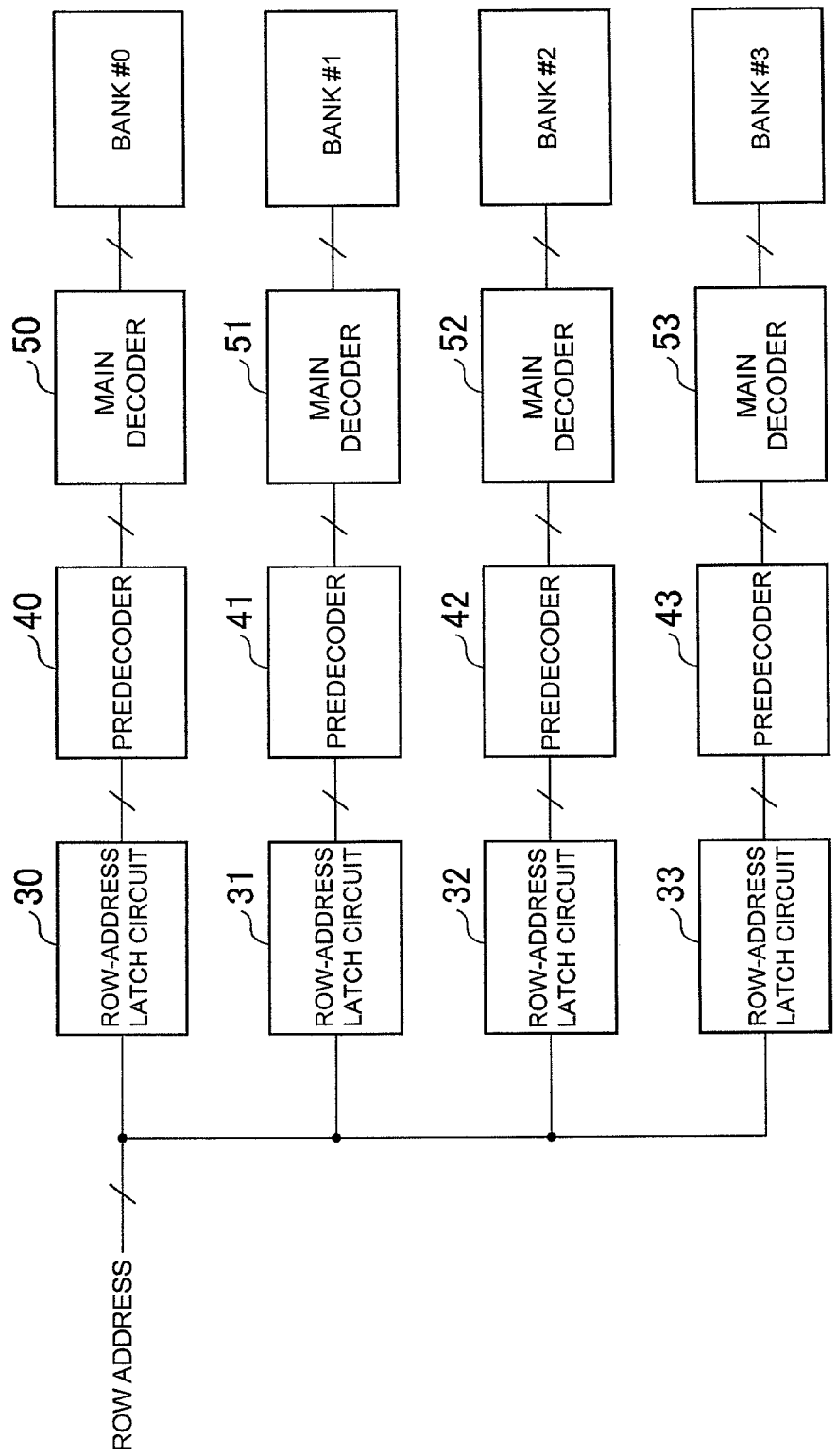
FIG. 14 is a block diagram showing a configuration of main parts of a general semiconductor memory device.
Figure 15:
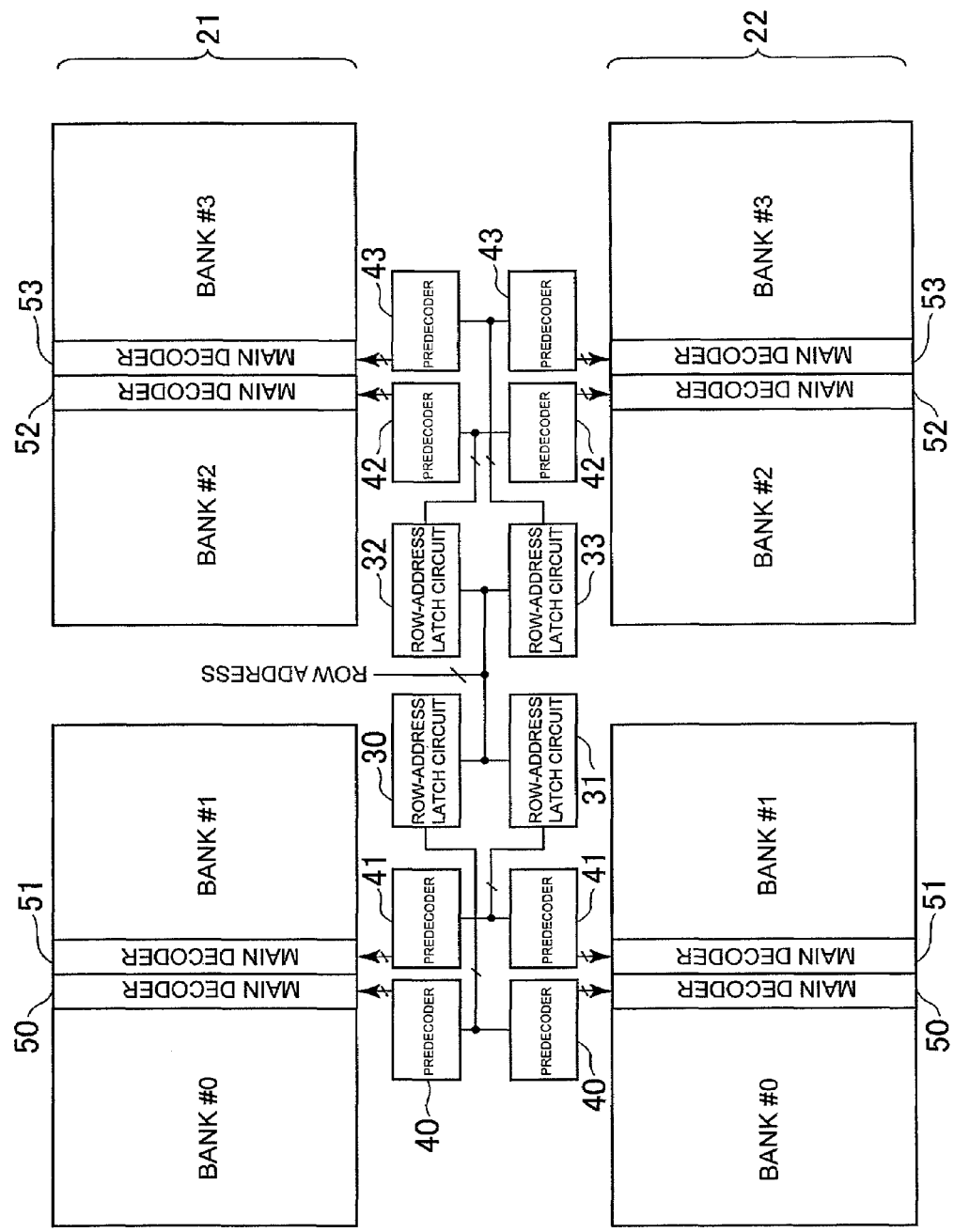
FIG. 15 is a schematic layout diagram of an example in which a circuit configuration shown in FIG. 14 is applied to a semiconductor memory device of which banks are positioned in an aligning manner.

As shown in FIG. 9, the semiconductor memory device has a layout adopted when the banks #0 to #3 are positioned in an aligning manner, and the pad electrode regions (not shown) are arranged at the ends of a chip as shown in FIG. 13. That is, a positional relation between the pad electrode regions and the banks #0 to #3 is the same as that of the overall layout shown in FIG. 13, and each of the banks #0 to #3 is positioned in an aligning manner between the two pad electrode regions each of which has a plurality of pads being arranged.

The banks #0 to #3 are divided into a sub-bank region 191 positioned on one pad electrode region side and a sub-bank region 192 positioned on the other pad electrode region side. Data inputted and outputted via the pad electrodes included in one pad electrode region is read from or written into the sub-bank region 191, and data inputted and outputted via the pad electrodes included in the other pad electrode region is read from or written into the sub-bank region 192. The reading from and the writing into the sub-bank region 191 and the reading from and the writing into the sub-bank region 192 are performed simultaneously, and thereby, even when the number of bits to be inputted and outputted simultaneously is large, it is possible to shorten the data wire without causing imbalance of the data wire length.

Thus, the overall layout is the same as that shown FIG. 13. However, in the present embodiment, the address through predecoder is used, and as a result, the predecoders 101 and 102 are arranged in common to the banks #0 and #1, and the predecoders 103 and 104 are arranged in common to the banks #2 and #3, as shown in FIG. 9. The latch circuits 112 and 113 are arranged adjacent to the predecoders 101 and 102, and the latch circuits 115 and 116 are arranged adjacent to the predecoders 103 and 104. On the other hand, the main decoder 121 is arranged between the banks #0 and #1, and the main decoder 122 is arranged between the banks #2 and #3.

Thereby, the predecode signals, which are the outputs of the predecoders 101 to 104, are wired along the longitudinal direction of the main decoders 121 and 122. Herein, regarding the number of predecode signals, since each of the outputs of the predecoders 101 and 103 is $2^{a1}+2^{a2}+2^c$ and each of the outputs of the predecoders 102 and 104 is $2\times(2^{b1}+2^{b2})$, $2^{a1}+2^{a2}+2^c+2\times(2^{b1}+2^{b2})$ of predecode signals are wired between each bank. Accordingly, as in the example, when a1=2 bits, a2=2 bits, b1=3 bits, b2=3 bits, and c=2 bits are established, a total number of predecode signals wired between each bank is 44, and hence the number is greatly reduced as compared to the conventional number of wires (56).

Further, one portion of the predecode signals ($PD_{MAT}A$, $PD_{MAT}B$, and $PD_{SWL}$) is shared between the two banks. However, these signals and its decoded signals are held in the latch circuits (311, 312, 331, and 333) via the clocked inverters (301, 302, 321, and 323) each synchronized with the bank select signals. Thus, independent operations by each bank can be secured.

Figure 10:
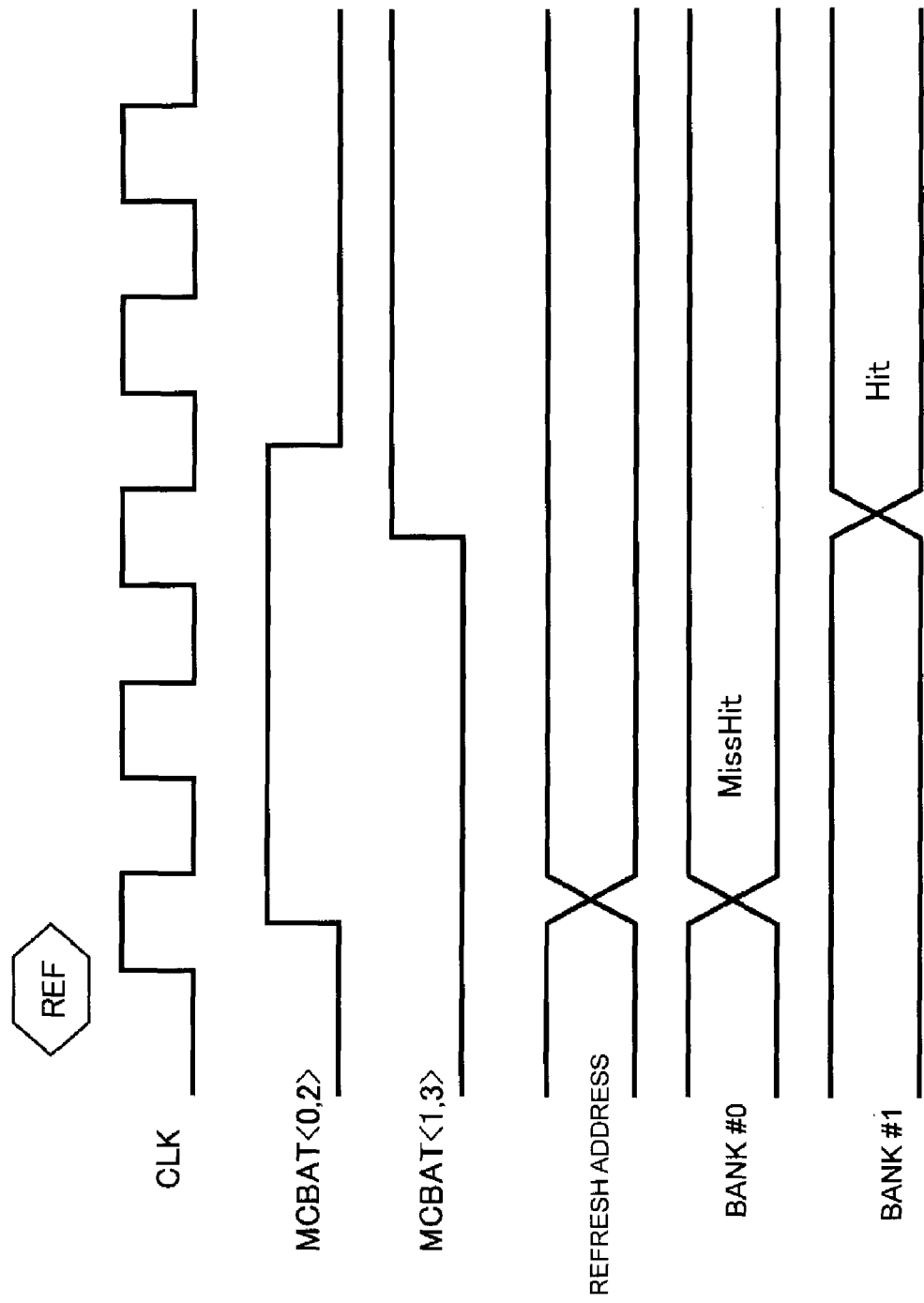
FIG. 10 is a timing chart for explaining an operation at the time of refreshing the semiconductor memory device according to the present embodiment.
Figure 11:
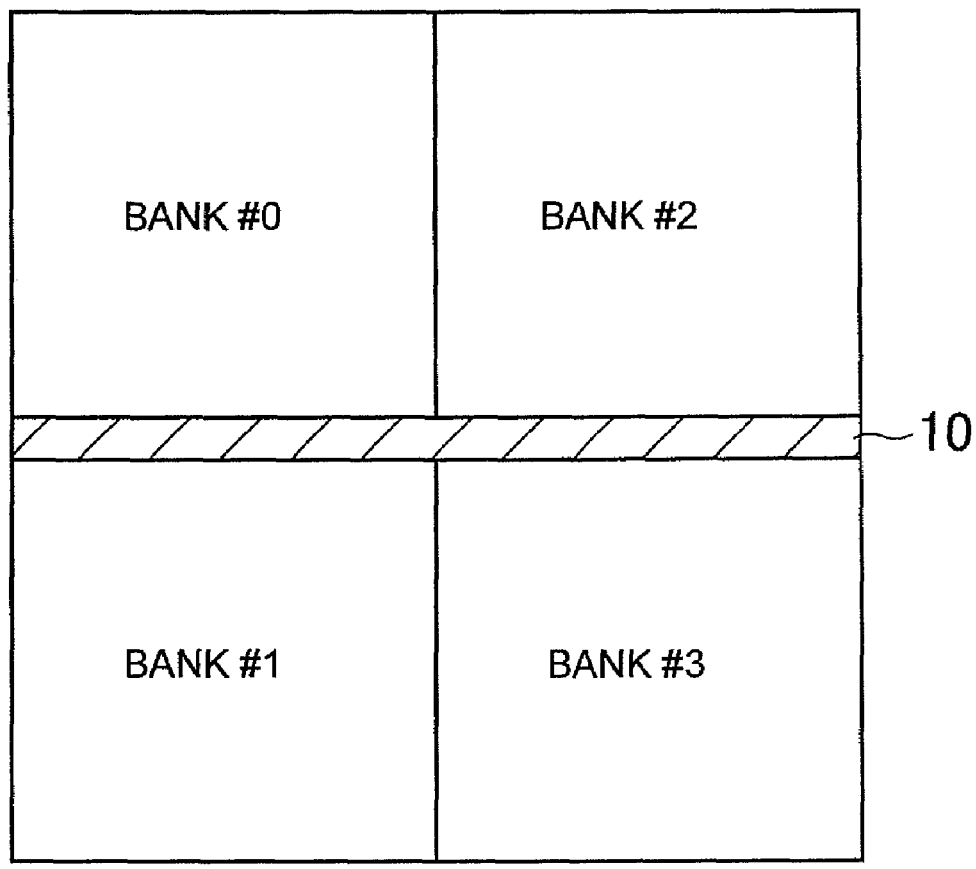
FIG. 11 is a schematic diagram showing a general bank arrangement in a semiconductor memory device.
Figure 12:
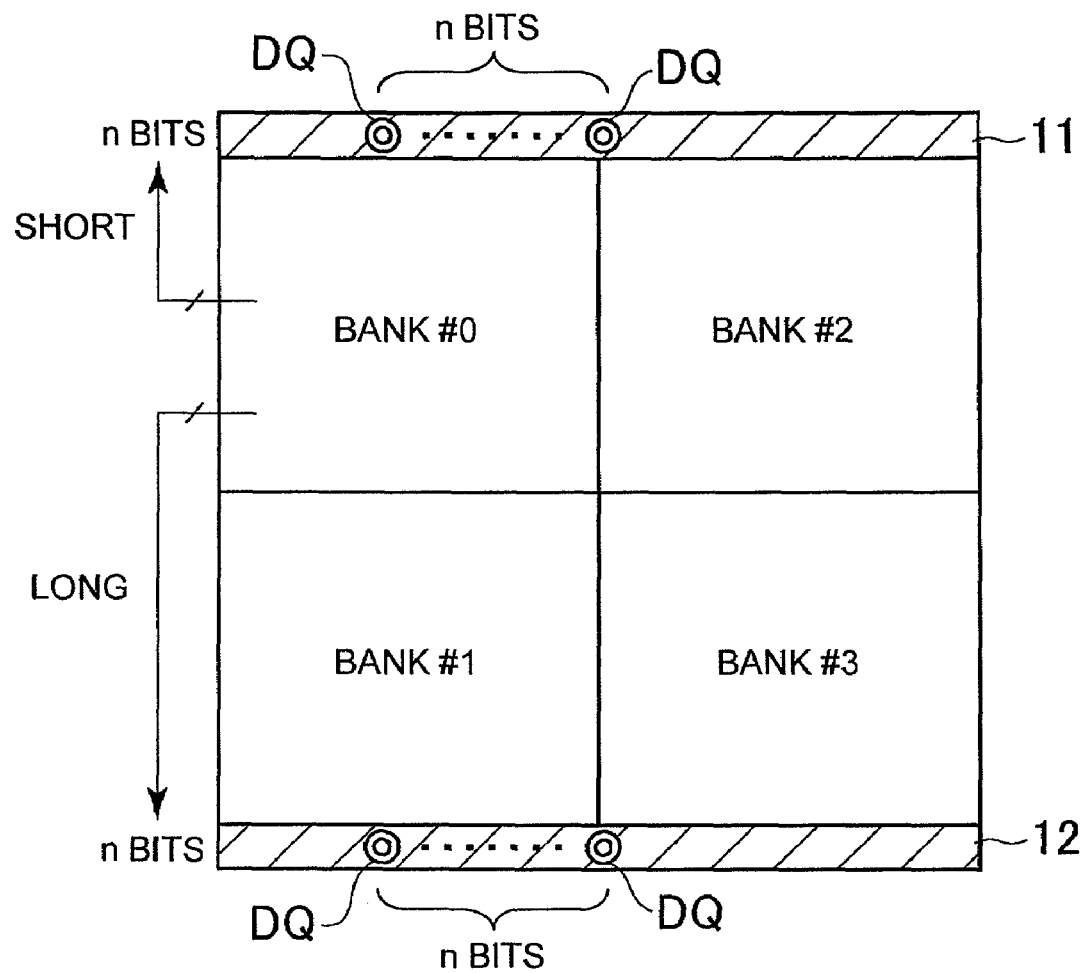
FIG. 12 is a schematic diagram showing an example in which pad electrode regions are arranged in ends of a chip in the semiconductor memory device shown in FIG. 11.

FIG. 10 is a timing chart for explaining an operation at the time of refreshing the semiconductor memory device according to the present embodiment.

Generally, when a refresh command is issued, all the banks are simultaneously rendered active. However, as shown in FIG. 10, in the semiconductor memory device, a waveform of a signal MCBAT<0,2> for rendering active the banks #0 and #2 and that of a signal MCBAT<1,3> for rendering active the banks #1 and #3 are imparted a predetermined time difference. As a result, in response to the refresh command, the refresh address is alternatively supplied to the two banks (the banks #0 and #1 or the banks #2 and #3) that share the main decoder 121 or 122, instead that a refresh address being commonly supplied to all the banks #0 to #3.

This is because, when the refresh address is simultaneously supplied to the two banks, a replacement operation of a defect cell by a redundant circuit is erroneously operated. That is, when the redundant circuit corresponding to one bank performs a hit detection, the replacement to a redundant cell is performed on the both banks, and hence a normal cell, which is not to be replaced, of the other bank is not refreshed.

In view of this point, in the present embodiment, the waveforms of the signals MCBAT<0,2> and MCBAT<1,3> are imparted the predetermined time difference, and thereby, the refresh address is alternatively supplied to the two banks to avoid the above problem.

As explained above, according to the present embodiment, the address through predecoder is used, and hence one portion of the predecode signal is shared by the two banks. As a result, it becomes possible to reduce the number of predecode signals wired between the banks. In addition, because the address is latched at a later stage of the predecoder, a delay by a latch margin (tRCD) does not occur, thereby making it possible to enlarge an operating margin.

According to the present invention, the address signal is not latched in each bank, but a so-called address through predecoder is used to latch a predecode signal. Thereby, one portion of the predecode signal can be shared between the banks. Thus, it becomes possible to reduce the wires for the predecode signal installed between the banks. In addition, a delay by a latch margin (tRCD) does not occur in each bank, and hence it becomes possible to enlarge an operating margin.

The present invention is in no way limited to the aforementioned embodiments, but rather various modifications are possible within the scope of the invention as recited in the claims, and naturally these modifications are included within the scope of the invention.

What is claimed is:

1. A semiconductor memory device comprising:
   a plurality of banks independently operable;
   a predecoder that predecodes an address signal to generate a predecode signal including first and second portions;
   first latch circuits, each of which is assigned to the plurality of banks, that hold the first portion of the predecode signal;
   a main decoder that is assigned in common to at least two of the plurality of banks, and receives the second portion of the predecode signal and outputs of the first latch circuits, wherein
   the main decoder includes second latch circuits that hold by each bank a decoded signal obtained by decoding the second portion of the predecode signal.

2. The semiconductor memory device as claimed in claim 1, wherein the address signal is a row address, and the first portion of the predecode signal includes a main-word select predecode signal for selecting a main word line.

3. The semiconductor memory device as claimed in claim 2, wherein the second portion of the predecode signal includes a memory-mat select predecode signal for selecting a memory mat and a sub-word select predecode signal for selecting a sub word line.

4. The semiconductor memory device as claimed in claim 3, wherein the main decoder includes:
   a main-word control circuit that generates a first internal signal by each bank based on at least the memory-mat select predecode signal and a bank select signal;
   a main-word output circuit that generates a main-word-line select signal by each bank based on at least the main-word select predecode signal and the corresponding first internal signal; and
   a sub-word control circuit that generates a sub-word-line select signal by each bank based on at least the sub-word select predecode signal and the bank select signal.

5. The semiconductor memory device as claimed in claim 4, wherein the sub-word control circuit generates the sub-word-line select signal further based on the memory-mat select predecode signal.

6. The semiconductor memory device as claimed in claim 5, wherein the second latch circuits includes:
   a plurality of memory-mat select latch circuits, included in the main-word control circuit, that synchronize the memory-mat select predecode signal or a second internal signal obtained by decoding the memory-mat select predecode signal with the bank select signal and hold by each bank; and
   a plurality of sub-word select latch circuits, included in the sub-word control circuit, that synchronize the sub-word select predecode signal or a third internal signal obtained by decoding the sub-word select predecode signal with the bank select signal and hold by each bank.

7. The semiconductor memory device as claimed in claim 4, wherein the second latch circuits includes:
   a plurality of memory-mat select latch circuits, included in the main-word control circuit, that synchronize the memory-mat select predecode signal or a second internal signal obtained by decoding the memory-mat select predecode signal with the bank select signal and hold by each bank; and
   a plurality of sub-word select latch circuits, included in the sub-word control circuit, that synchronize the sub-word select predecode signal or a third internal signal obtained by decoding the sub-word select predecode signal with the bank select signal and hold by each bank.

8. The semiconductor memory device as claimed in claim 1, wherein the main decoder is arranged between commonly assigned banks, and the predecode signal is formed along a longitudinal direction of the main decoder.

9. The semiconductor memory device as claimed in claim 8, further comprising first and second pad electrode regions, both of which include a plurality of pad electrodes, wherein all the plurality of banks are positioned in an aligning manner between the first and second pad electrode regions.

10. The semiconductor memory device as claimed in claim 9, wherein
    the plurality of banks are divided into a first sub-bank region positioned on a side of the first pad electrode region and a second sub-bank region positioned on a side of the second pad electrode region,
    data inputted and outputted via pad electrodes included in the first pad electrode region is read from or written into the first sub-bank region, and
    data inputted and outputted via pad electrodes included in the second pad electrode region is read from or written into the second sub-bank region.

11. The semiconductor memory device as claimed in claim 10, wherein reading from or writing into the first sub-bank region and reading from or writing into the second sub-bank region are performed simultaneously.

12. The semiconductor memory device as claimed in claim 1, wherein in response to a refresh command, a refresh address is alternatively supplied to the banks to which the main decoder is commonly assigned.

13. The semiconductor memory device as claimed in claim 1, wherein the predecoder is an address through type into which that the address is not latched at a stage before inputted.

* * * * *